US012682937B2

(12) United States Patent
Yudanov et al.

(10) Patent No.: US 12,682,937 B2
(45) Date of Patent: Jul. 14, 2026

(54) PROCESSING IN MEMORY REGISTERS

(71) Applicant: Micron Technology, Inc., Boise, ID (US)

(72) Inventors: Dmitri Yudanov, Sacramento, CA (US); James B. Johnson, Boise, ID (US); Peter L. Brown, Eagle, ID (US); Glen E. Hush, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 177 days.

(21) Appl. No.: 18/786,480

(22) Filed: Jul. 27, 2024

(65) Prior Publication Data

US 2025/0069629 A1 Feb. 27, 2025

Related U.S. Application Data

(60) Provisional application No. 63/578,903, filed on Aug. 25, 2023.

(51) Int. Cl.
*G11C 7/10* (2006.01)
*G11C 7/08* (2006.01)
*G11C 7/22* (2006.01)

(52) U.S. Cl.
CPC .............. *G11C 7/1069* (2013.01); *G11C 7/08* (2013.01); *G11C 7/222* (2013.01)

(58) Field of Classification Search
CPC ......... G11C 7/1069; G11C 7/08; G11C 7/222; G11C 7/1012; G11C 7/06; G11C 7/10
USPC ...................................... 365/189.011
See application file for complete search history.

(56) References Cited

U.S. PATENT DOCUMENTS

2021/0389930 A1* 12/2021 Ramesh ............... G11C 7/1006

* cited by examiner

*Primary Examiner* — Huan Hoang
(74) *Attorney, Agent, or Firm* — Brooks, Cameron & Huebsch, PLLC

(57) ABSTRACT

Processing can occur in registers of a memory sub-system. A first plurality of registers coupled to the plurality of sense amplifiers can store the first plurality of bits received from the plurality of sense amplifiers. Processing circuitry coupled to the first plurality of registers can receive the first plurality of bits from the first plurality of registers and can perform an operation on the first plurality of bits to generate result bits. A second plurality of registers coupled to the processing circuitry and the plurality of registers can store the result bits received from the processing circuitry and can provide the result bits to a plurality of data input/output (I/O) lines prior to storing a second plurality of bits.

20 Claims, 5 Drawing Sheets

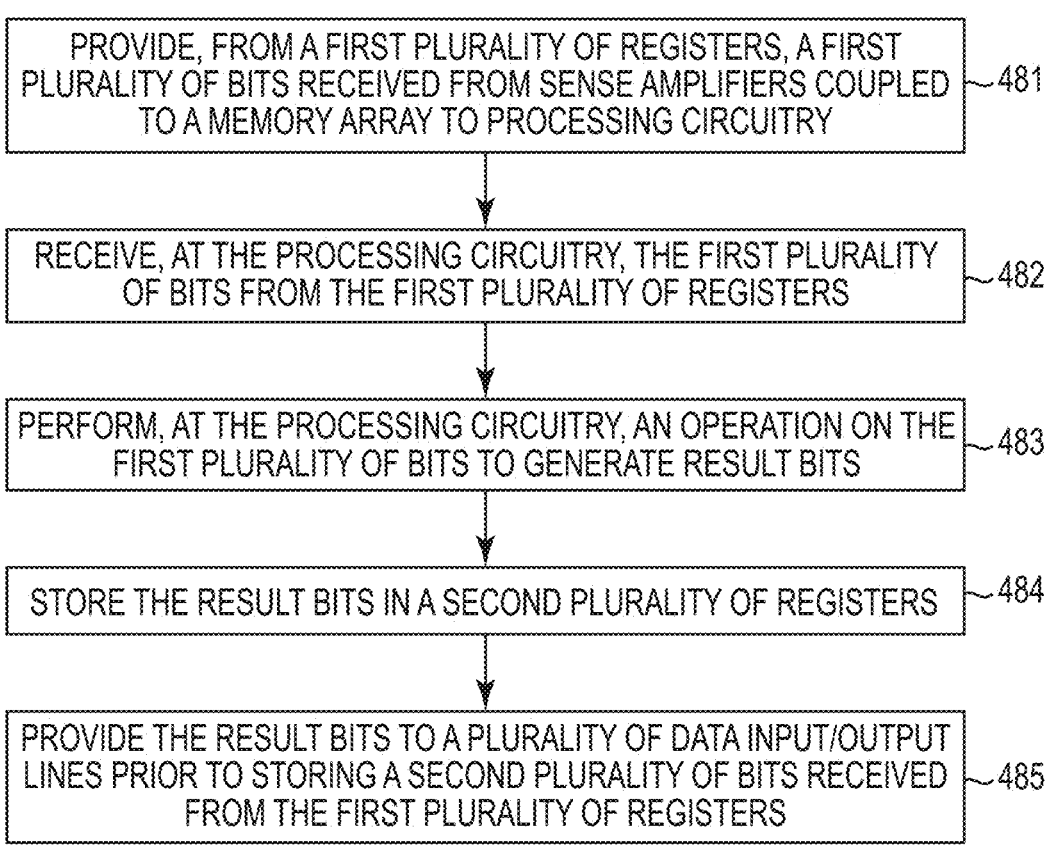

480

PROVIDE, FROM A FIRST PLURALITY OF REGISTERS, A FIRST PLURALITY OF BITS RECEIVED FROM SENSE AMPLIFIERS COUPLED TO A MEMORY ARRAY TO PROCESSING CIRCUITRY — 481

RECEIVE, AT THE PROCESSING CIRCUITRY, THE FIRST PLURALITY OF BITS FROM THE FIRST PLURALITY OF REGISTERS — 482

PERFORM, AT THE PROCESSING CIRCUITRY, AN OPERATION ON THE FIRST PLURALITY OF BITS TO GENERATE RESULT BITS — 483

STORE THE RESULT BITS IN A SECOND PLURALITY OF REGISTERS — 484

PROVIDE THE RESULT BITS TO A PLURALITY OF DATA INPUT/OUTPUT LINES PRIOR TO STORING A SECOND PLURALITY OF BITS RECEIVED FROM THE FIRST PLURALITY OF REGISTERS — 485

Fig. 4

PROCESSING IN MEMORY REGISTERS

PRIORITY INFORMATION

This application claims the benefit of U.S. Provisional Application No. 63/578,903, filed Aug. 25, 2023, the contents of which are included herein by reference.

TECHNICAL FIELD

The present disclosure relates generally to memory, and more particularly to apparatuses and methods associated with processing in memory registers.

BACKGROUND

Memory sub-systems are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory is also utilized as volatile and non-volatile data storage for a wide range of electronic applications, including, but not limited to personal computers, portable memory sticks, digital cameras, cellular telephones, portable music players such as MP3 players, movie players, and other electronic devices. Memory cells can be arranged into arrays, with the arrays being used in memory devices.

BRIEF DESCRIPTION OF THE DRAWINGS

FIG. 4 illustrates an example flow diagram of a method for performing operations in registers of a memory subsystem in accordance with a number of embodiments of the present disclosure.

DETAILED DESCRIPTION

Figure 1:
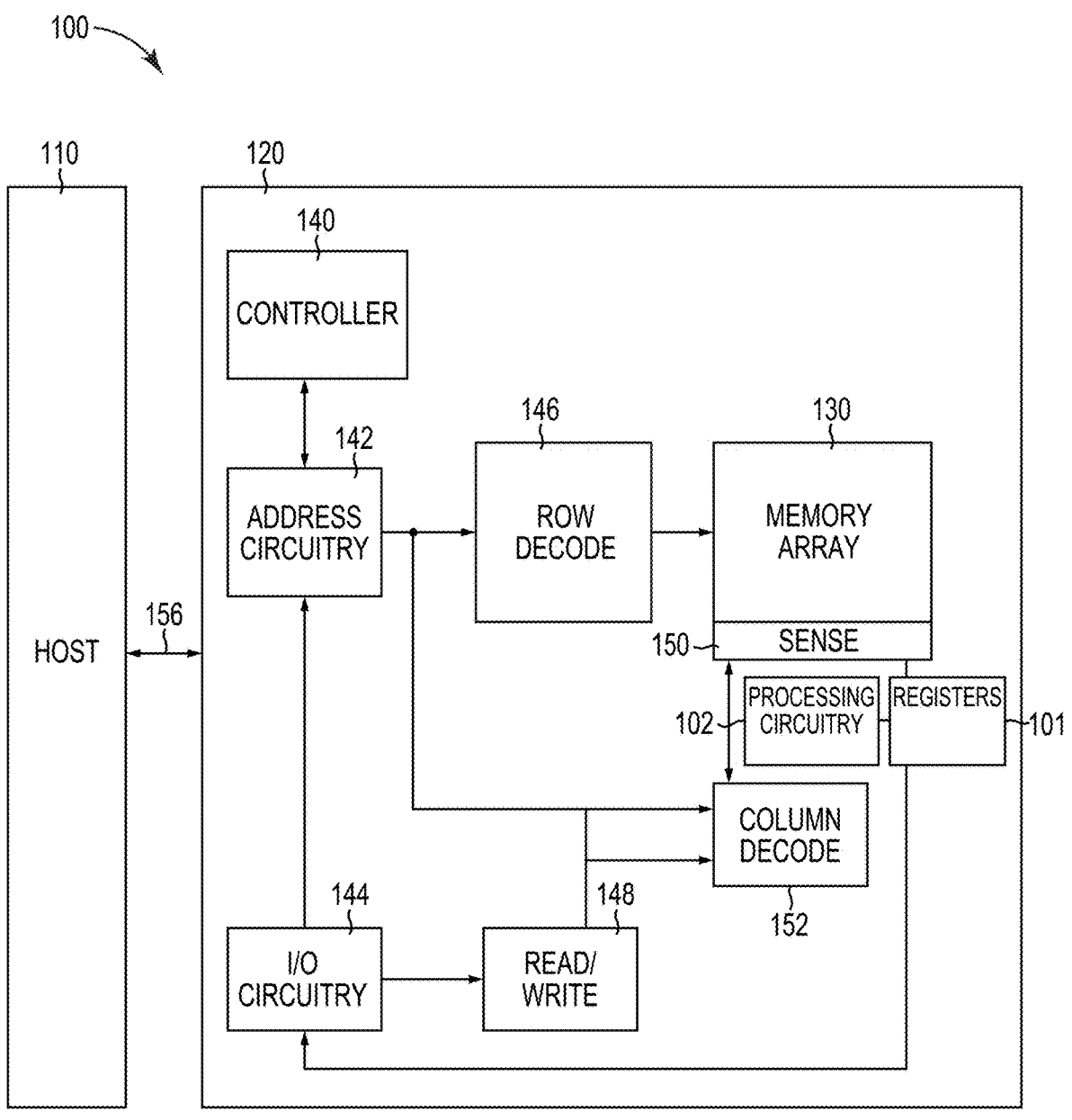
FIG. 1 is a block diagram of an apparatus in the form of a computing system including a memory sub-system in accordance with a number of embodiments of the present disclosure.

The present disclosure includes apparatuses and methods related to performing operations in registers of a memory sub-system. In various examples, a first plurality of registers coupled to the plurality of sense amplifiers can store a first plurality of bits received from the plurality of sense amplifiers of a memory sub-system. Processing circuitry coupled to the first plurality of registers can receive the first plurality of bits from the first plurality of registers and can perform an operation on the first plurality of bits to generate result bits. A second plurality of registers coupled to the processing circuitry and the plurality of registers can store the result bits received from the processing circuitry and can provide the result bits to a plurality of data input/output (I/O) lines prior to storing a second plurality of bits.

Data read from a memory array can be provided to a host via a plurality of I/O lines that couple the memory array to an interface of the memory sub-system. Data read from the memory array can be provided to the plurality of I/O lines based on clock signals that signal a timing for providing the data. The data read from the memory array may be available to provide to the plurality of I/O lines prior to the I/O lines being ready to receive the data based on the clock signal. A plurality of registers is implemented between the memory array and the I/O lines to hold the data until the clock signal indicates that the data is to be moved to the I/O lines. The plurality of registers can be latency equalization registers because data is stored in the registers until the I/O lines are ready to receive the data. The latency of storing the data in the registers can be equal to the latency to moving the data to the I/O lines by holding the data in the registers. The registers can be first in, first out (FIFO) registers because the first data stored in the registers is the first data retrieved from the registers. The plurality of registers can be referred to as latency equalization FIFO registers. Holding the data in the registers (e.g., latency equalization) can be inefficient given that the data isn't utilized while the data is stored in the register.

Aspects of the present disclosure address the above and other deficiencies by performing operations utilizing the data as the data is being stored in and/or passing through the registers. For example, first data and second data can be stored in the registers. The first data can be stored in a first layer of registers and the second data can be stored in a second layer of the registers. After the second data is moved to the I/O lines, the first data can be moved from the first layer to the second layer of the registers. Instead of moving the first data to the second layer of registers or in addition of moving the first data to the second layer of registers, operations can be performed utilizing the first data. The results of the operations can be stored in the second layers of registers. Performing operations on the data while the data is stored in the registers or as the data is moved through the registers can allow for a more efficient utilization of the data.

As used herein, "a number of" something can refer to one or more of such things. For example, a number of memory sub-systems can refer to one or more memory sub-systems. A "plurality" of something intends two or more. Additionally, designators such as "M," as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIG. 1 is a block diagram of an apparatus in the form of a computing system 100 including a memory sub-system 120 in accordance with a number of embodiments of the present disclosure. As used herein, a memory sub-system 120, a memory array 130, and/or host 110, for example, might also be separately considered an "apparatus."

In this example, system 100 includes a host 110 coupled to memory sub-system 120 via an interface 156. The computing system 100 can be a personal laptop computer, a desktop computer, a digital camera, a mobile telephone, a memory card reader, or an Internet-of-Things (IoT) enabled device, among various other types of systems. Host 110 can include a number of processing resources (e.g., one or more processors, microprocessors, or some other type of controlling circuitry) capable of accessing memory sub-system 120. The system 100 can include separate integrated circuits, or both the host 110 and the memory sub-system 120 can be on the same integrated circuit. For example, the host 110 may be a system controller of multiple memory sub-systems 120, with the system controller 110 providing access to the respective memory sub-systems 120 by another processing resource such as a central processing unit (CPU).

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines (which may be referred to herein as digit lines or data lines). Although a single array 130 is shown in FIG. 1, embodiments are not so limited. For instance, memory sub-system 120 may include a number of arrays 130 (e.g., a number of banks of DRAM cells). The memory array 130 may be referred to as a memory device.

The memory sub-system 120 includes address circuitry 142 to latch address signals provided over an interface 156. The interface can include, for example, a physical interface employing a suitable protocol (e.g., a data bus, an address bus, and a command bus, or a combined data/address/ command bus). Such protocol may be custom or proprietary, or the interface 156 may employ a standardized protocol, such as Peripheral Component Interconnect Express (PCIe), Gen-Z, CCIX, or the like. Address signals are received and decoded by a row decoder 146 and a column decoder 152 to access the memory array 130. Data can be read from memory array 130 by sensing voltage and/or current changes on the sense lines using sensing circuitry 150. The sensing circuitry 150 can comprise, for example, sense amplifiers that can read and latch a page (e.g., row) of data from the memory array 130. The I/O circuitry 144 can be used for bi-directional data communication with host 110 over the interface 156. The read/write circuitry 148 is used to write data to the memory array 130 or read data from the memory array 130. As an example, the circuitry 148 can comprise various drivers, latch circuitry, etc.

Controller 140 decodes signals provided by the host 110. These signals can include chip enable signals, write enable signals, and address latch signals that are used to control operations performed on the memory array 130, including data read, data write, and data erase operations. In various embodiments, the controller 140 is responsible for executing instructions from the host 110. The controller 140 can comprise a state machine, a sequencer, and/or some other type of control circuitry, which may be implemented in the form of hardware, firmware, or software, or any combination of the three.

The memory sub-system 120 can also include the registers 101 and the processing circuitry 102. The registers 101 and the processing circuitry 102 can be implemented in the form of hardware. The registers 101 can be coupled to the sensing circuitry 150 and I/O circuitry 144 which can comprise I/O lines (e.g., data I/O lines). The processing circuitry 102 can be coupled to the registers 101. In various instances, the controller 140 can control the transfer of data, read from the memory array 130, to the sensing circuitry 150 and the transfer of data from the sensing circuitry 150 to the registers 101. The controller 140 can also control the performance of operations utilizing data stored in the registers 101. The processing circuitry 101 can perform the operations.

The registers 101 can be referred to as latency equalization registers. The registers 101 can hold data during pipeline access (e.g., bursts) for its subsequent staging to I/O lines of the I/O circuitry 144. The holding of the data until the I/O lines are ready to accept the data can be referred to as latency equalization. The registers 101 can hold the data to accommodate for data latency variability in the array due.

The registers 101 can also be referred to as a first in, first out (FIFO) registers (e.g., latency equalization FIFO registers). The register 101 can be FIFO registers because the first data to be stored in the registers 101 is the first data provided to the I/O lines. For example, if first data is stored to the registers 101 before second data, then the first data can be provided to the I/O lines prior to providing the second data.

The time utilized to move data through the registers 101 can be utilized to perform operations without impact to protocol timing (e.g., time for data to be provided from sensing circuitry to the I/O lines). The operations performed on the data as the data moves through the registers 101 can be addition operations, subtraction operation, multiplication operations, division operation, multiply accumulate (MAC) operation, among other operations that can be performed. The circuitry implemented to perform the operations can be referred to as the processing circuitry 102. In various instances, the processing circuitry 102 can be referred to as MAC circuitry.

The processing circuitry 102 can be utilized to implement a deep learning accelerator (DLA) or to supplement the processing performed by a DLA implemented in the memory sub-system 120. For example, the processing circuitry 102 can be utilized to implement an artificial neural network (ANN). For example, the processing circuitry 102 can generate inferences for the ANN. The processing circuitry 102 can also be utilized to process column access command extensions, for example.

Figure 2:
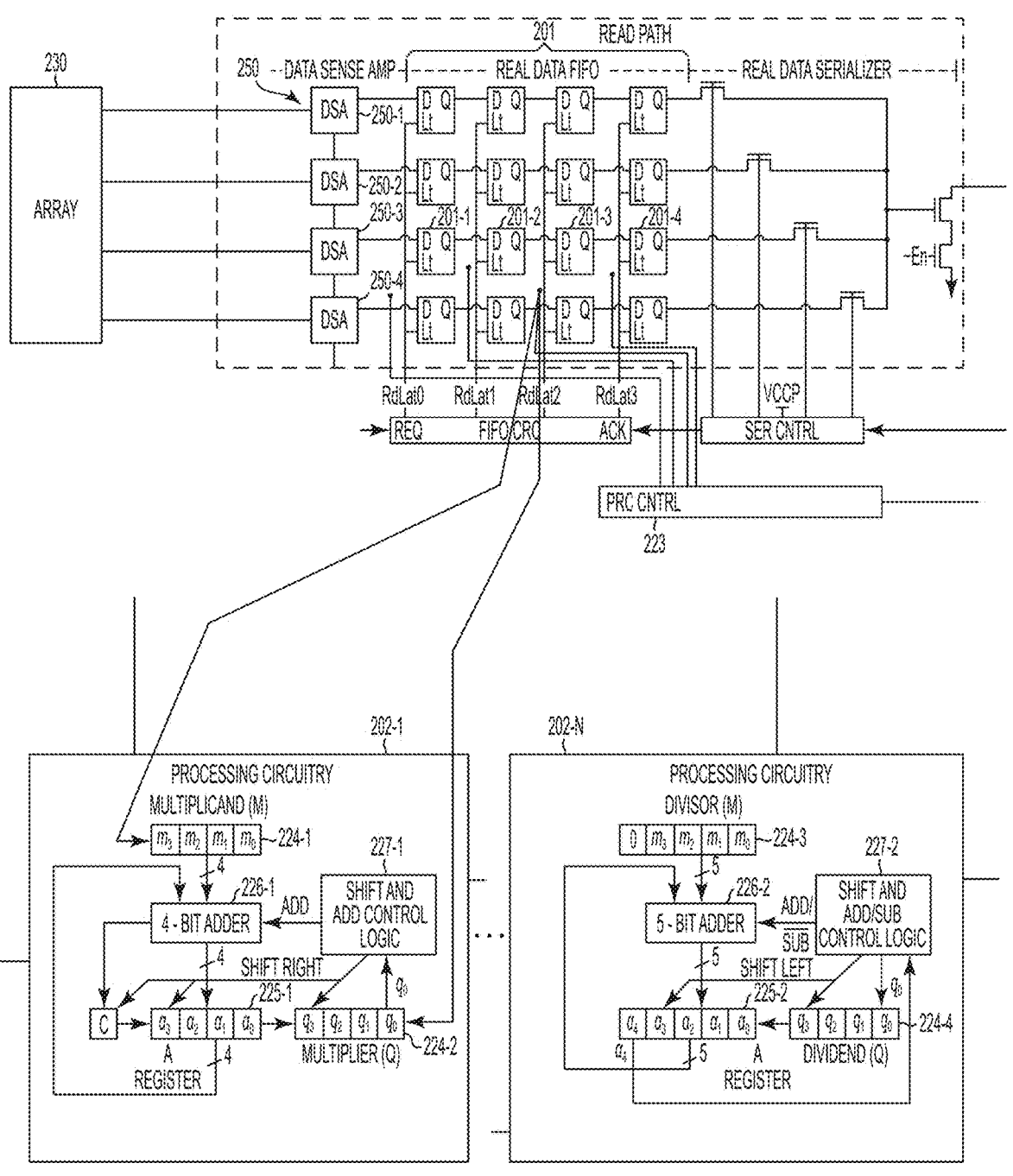
FIG. 2 is a block diagram of registers and processing circuitry in accordance with a number of embodiments of the present disclosure.

FIG. 2 is a block diagram of registers 201-1, 201-2, 201-3, 201-4 and processing circuitry 202-1, 202-2 in accordance with a number of embodiments of the present disclosure. FIG. 2 shows a memory array 230, sense amplifiers 250-1, 250-2, 250-3, 250-4, registers 201-1, 201-2, 201-3, 201-4, and processing circuitry 202-1, 202-2. The sense amplifiers 250-1, 250-2, 250-3, 250-4 can be referred to as sensing circuitry 250. The registers 201-1, 201-2, 201-3, 201-4 can be referred to as registers 201. The processing circuitry 202-1, 202-2 can be referred to as processing circuitry 202.

Data values can be read from memory cells of the memory array 230. The signals representing the data values can be provided from the memory cells of the memory array 230 to the sensing circuitry 250. The sensing circuitry 250 can provide the data to the registers 201. The data can be comprised of bits. In the example of FIG. 2, four sense amplifiers 250-1, 250-2, 250-3, 250-4 are utilized to sense four bits read from the memory array 230. However, the examples described herein can include more than four bits. For instance, 32, 64, 120, or 256 bits can be read from the memory array 230 at a same time.

The data can be provided from the sensing circuitry 250 to the registers 201. Each of the registers 201 can be latches or flip-flops. As used herein, a flip-flop is edge-triggered (e.g., synchronous based on a clock signal) circuitry that stores a bit of data. A latch is level-triggered (e.g., asynchronous) circuitry that stores a bit of data. Flip-flops and latches can be utilized to store bits of data. The flow of data as the data passes through the registers 201 can differ based on whether the registers 201 are implemented as flip-flops or latches.

The registers 201 can be organized in layers. For instance, a first layer of the registers 201, including the register 201-1, can receive signals representing bits from the sensing circuitry 250. A second layer of the registers 201, including the register 201-2, can receive signals representing bits from the first layer of the registers or from processing circuitry 201-1. A third layer of the registers 201, including the register 201-3, can receive signals representing bits from the second layer or from processing circuitry 201-2. A fourth layer of the registers 201, including the registers 201-4, can receive signals representing bits from the third layer or a different processing circuitry (not shown). The fourth layer of the registers 201 can provide the bits to I/O circuitry including I/O lines. Although four layers of 16 registers are shown, the examples described can be applied to more layers and/or registers.

In various instances, processing circuitry can be implemented in between each layer of the registers 201, before the first layer of the registers 201, and/or after the last layer of the registers 201. For example, the first layer of the registers 201 can be coupled to processing circuitry 202-1. The processing circuitry 202-1 can also be coupled to the second layer of the registers 201. The second layer of the registers can be coupled to the processing circuitry 202-2. The processing circuitry 202-2 can also be coupled to a third layer of the registers 201. The third layer of registers 201 can be coupled to a third processing circuitry (not shown). The third processing circuitry can be coupled to the fourth layer of the register 201. In the examples described herein, there can be less implementations (e.g., 3) of the processing circuitry than there are layers (e.g., 4) of the registers 201. In various examples, there can be more implementations of the processing circuitry than there are layers of the registers 201.

Each of the registers of a layer can be coupled to an implementation of the processing circuitry. For example, each of the registers, including register 201-1, of the first layer can be coupled to the processing circuitry 202-1 such that the processing circuitry 202-1 receives bits from each register of the first layer. The processing circuitry 202-1 can provide a bit to each of the registers of the second layer including the register 201-2. The bits provided by the processing circuitry 202 can be the output of operations performed utilizing the inputs provided by the layers of the registers 202.

Figure 3:
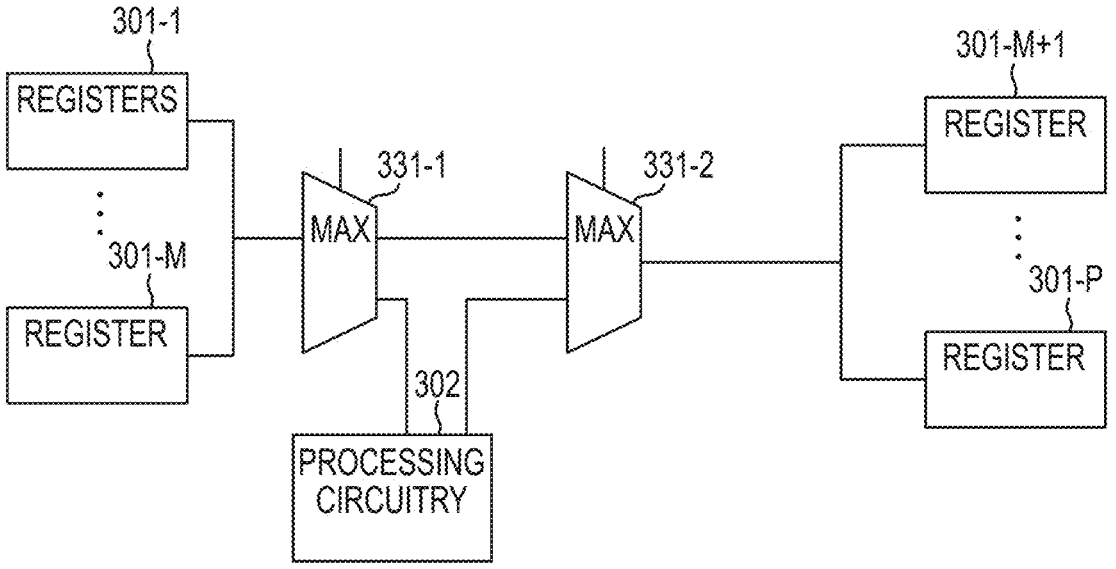
FIG. 3 is a block diagram of registers, processing circuitry, and multiplexors in accordance with a number of embodiments of the present disclosure.

In various instances, the transfer of data between the layers of the registers 201, the processing circuitry 202, and different layers of the registers 201 can be controlled by a FIFO controller which itself is controlled by the controller 140 of FIG. 1 as further described in FIG. 3. The processing circuitry 202 can be controlled by a processing controller 223. The processing controller 223 can be controlled by the controller 140.

Although not shown, multiple implementations of the processing circuitry 202 can be implemented between layers of the registers. For example, the processing circuitry 202-1 and the processing circuitry 202-2 can be implemented between a first layer and a second layer of the registers 201. The processing controller 223 can indicate whether the bits provided by the first layer are provided to the first processing circuitry (e.g., the processing circuitry 202-1), the second processing circuitry (e.g., the processing circuitry 202-2), and/or a second layer of the registers 201.

In other examples, an implementation of the processing circuitry 202 can be distributed between multiple layers. For example, a first portion of the processing circuitry 202-1 can be implemented between a first layer and a second layer while a second portion of the processing circuitry 202-1 is implemented between the second layer and the third layer of the registers 201. The first portion of the processing circuitry 202-1 can perform a first plurality of operations while the second portion implements a second plurality of operations. For example, the first portion of the processing circuitry 202-1 and the second portion of the processing circuitry can perform MAC operations.

The processing circuitry 202-1 can perform a multiplication operation. The processing circuitry 202-2 can perform a division operation, among other possible operations that can be performed by the processing circuitry 202. The processing circuitry 202 can receive inputs 224-1, 224-2, 224-3, 224-4, referred to as inputs 224. The processing circuitry 202 can include adders 226-1, 226-2, shift and addition/subtraction control logic 227-1, 227-2, and/or registers 225-1, 225-2 used to perform the operations.

In various instances, the inputs 224 received by the processing circuitry 202-1 can be received from a single layer of registers or from multiple layers of registers. For example, the four bits of the inputs 224-1 (e.g., $m_0$, $m_1$, $m_2$, $m_3$) and the four bits of the input 224-2 (e.g., $q_0$, $q_1$, $q_2$, $q_3$), can be received from a first layer of registers concurrently. Alternatively, the four bits of the inputs 224-1 (e.g., $m_0$, $m_1$, $m_2$, $m_3$) and the four bits of the input 224-2 (e.g., $q_0$, $q_1$, $q_2$, $q_3$), can be received from a first layer of registers sequentially. For instance, at a first time the first layer of registers can provide a first number of bits of the input 224-1 (e.g., $m_0$, $m_1$, $m_2$, $m_3$) and at a second time the first layer of registers can provide a second number of bits of the input 224-2 (e.g., $q_0$, $q_1$, $q_2$, $q_3$), where the second number of bits are provided by the first layer of registers 201 after the first number of bits are provided by the first layer of the registers 201.

The processing circuitry 202 can include registers 225-1, 225-2 that are separate from the registers 201. The registers 225-1, 225-2 are internal to the processing circuitry 202 and are not part of the FIFO registers 201. The registers 225-1, 225-2, referred to as registers 225, can be utilized to store an output of the operations performed by the adders 226-1, 226-2, and/or the shift addition/subtraction control logic 227-1, 227-2. In various instances, the shift addition/subtraction control logic 227-1, 227-2 can perform shift operations on the input data and can store the shifted data in the registers 225-1, 225-2. The shift addition/subtraction control logic 227-1, 227-2 can perform the shift operations on one or both of the inputs. For example, the shift addition/subtraction control logic 227-1 can perform a shift operation on the input 224-1 or on the inputs 224-1, 224-2 and perform addition operations. The shift addition/subtraction control logic 227-1, 227-2 can perform a shift of for each bit of the operand and can perform an addition when the operand is a "1". The shift addition/subtraction control logic 227-1, 227-2 can also invert a subtrahend and can invert a carry bit for 2's complement subtraction.

The registers 225 can comprise a quantity of registers equal to the quantity of bits of one of the input data. For example, the register 225-1 can comprise four registers while the input 224-1 and the input 224-2 each comprises four bits.

In various instances, the passing of the data through the registers 201 can differ based on whether the registers 201 are implemented as flip-flops or latches. If the registers 201 are implemented as latches, then the data can pass through the registers 201 without being first stored in the registers 201. If the registers 201 are implemented as flip-flops, then the data is stored at each layer of the registers 201 prior to being provided to the next layer of the registers 201.

If the registers 201 are implemented using latches, then the data can be provided to the first layer of the registers 201. If the second layer of the registers 201 actively store different data, then the data can be stored in the first layer of the registers 201. If the second layer of the registers 201 is vacant and does not actively store different data, then the data can pass through the first layer of the registers 201. The data can be provided to the processing circuitry 202-1 or to the second layer of the registers 201.

A first output of the processing circuitry 202-1 or the data provided by the first layer of the registers 201 can be provided to the second layer of the registers 201. If the third layer of the registers 201 actively stores different data, then the first output or the data can be stored in the second layer of the registers 201. If the third layer of the registers 201 does not actively store different data, then the first output of the processing circuitry 202-1 or the data can be provided to the third layer of the registers 201 or the processing circuitry 202-2. The processing circuitry 202-2 can generate a second output. The third layer of the registers 201 can receive the first output, the second output, or the data. If the fourth layer of the registers 201 actively stores different data, then the third layer of the registers 201 can store the first output, the second output, or the data. If the fourth layer of the registers 201 does not actively stores different data, then the first output, the second output, or the data can be provided to different processing circuitry (not shown) or the fourth layer. The different processing circuitry can generate a third output. The fourth layer of the registers 201 can store the first output, the second output, the third output, or the data. Based on a clock signal, the fourth layer can provide the first output, the second output, the third output, or the data to the I/O lines.

The processing circuitry 202 can generate multiple outputs utilizing data (e.g., input data) without the data or the outputs being stored in the first, second, and/or third layers of the registers 201 prior to being stored in the fourth layer of the registers 201 if the registers 201 are implemented as latches. The layer of the registers 201 can store data and/or outputs sequentially if later layers are being utilized to store different data.

If the registers 201 are implemented using flip-flops, then the data can be stored in each layer of the registers 201 prior to providing the data to a next layer of the registers 201. For example, the data read from the memory array can be stored in a first layer of the registers 201. The data can be provided to a second layer of the registers or the processing circuitry 202-1. The processing circuitry 202-1 can generate a first output.

The first output or the data can be provided to and stored in second layer or the registers 201. Based on a clock signal the first output or the data can be provided to the processing circuitry 202-2. The processing circuitry 202-2 can generate a second output. The first output, the second output, or the data can be provided to and stored in a third layer of the registers 201.

The third layer of the registers 201 can provide the data, the first output, or the second output to a third processing circuitry. The third processing circuitry can generate a third output. The data, the first output, the second output, or the third output can be provided to and stored in a fourth layer of the registers 201 prior to providing the data, the first output, the second output, or the third output to the I/O lines.

In various instances, some of the processing circuitry 202 can be utilized to perform operations and not other of the processing circuitry 202. For example, data can be provided to the second layer of the registers and not the processing circuitry 202-1 such that the processing circuitry 202-1 does not perform operations on the data. The data can be provided to the processing circuitry 202-2 to generate an output. The output can be stored in the third layer of the registers 202.

FIG. 3 is a block diagram of registers 301-1, . . . , 301-M, 301-M+1, . . . , 301-P, processing circuitry 302, and multiplexors 331-1, 331-2 in accordance with a number of embodiments of the present disclosure. The registers 301-1, . . . , 301-M can be a first layer of registers. The registers 301-M+1, . . . , 301-P can be a second layer of registers.

The processing circuitry 302 can be implemented between the first layer and the second layer of registers. The processing circuitry 302 can be implemented between the first layer and the second layer of registers if the processing circuitry 302 is coupled to the registers 301-1, . . . , 301-M and the registers 301-M+1, . . . , 301-P. The processing circuitry 302 can receive an input from the registers 301-1, . . . , 301-M and can provide an output to the registers 301-M+1, . . . , 301-P. The processing circuitry 302 can be coupled to the registers 301-1, . . . , 301-M through the MUX 331-1. The processing circuitry 302 is coupled to the registers 301-M+1, . . . , 301-P through the MUX 331-2.

Data can be moved from the registers 301-1, . . . , 301-M to the processing circuitry 302 or the registers 301-M+1, . . . , 301-P based on signals provided by the processing controller 223 of FIG. 2 and/or the controller of 140 of FIG. 1. The MUX 331-1 can receive the data from the registers 301-1, . . . , 301-M. Based on the signals provided by a controller (e.g., the processing controller 223 of FIG. 2 and/or the controller of 140 of FIG. 1), the MUX 331-1 can provide the data to the processing circuitry 302 or the MUX 331-2.

If the data is provided to the processing circuitry 302, the processing circuitry 302 can generate an output. The data or the output can be provided to the MUX 331-2. The MUX 331-2 can provide bits to the registers 301-M+1, . . . , 301-P based on a control signal provided by a controller. The control signal can indicate that the data from the registers 301-1, . . . , 301-M is to be provided to the registers 301-M+1, . . . , 301-P or that the output of the processing circuitry 302 is to be provided to the registers 301-M+1, . . . , 301-P. The registers 301-M+1, . . . , 301-P can store the data or the output.

In various instances, the control signal received by the MUX 331-1 and the control signal received by the MUX 331-2 can be synchronized. For example, If the control signal received by the MUX 331-1 indicates that the data from the registers 301-1, . . . , 301-M is to be provided to the registers 301-M+1, . . . 301-P, then the control signal received by the MUX 331-2 can also indicate that the signals received from the MUX 331-2 are to be provided to the registers 301-M+1, . . . , 301-P.

In various instances, if the control signals received by the MUX 331-1 indicate that the data is to be provided to the processing circuitry 302, then the data can be provided to the processing circuitry 302 while an output of operations previously performed by the processing circuitry 302 is provided to the MUX 331-2 or while no bits are provided to the MUX 331-2. If the control signal received by the MUX 331-1 indicates that the data is to be provide to the processing circuitry 302, then the MUX 331-2 can receive no signals from the MUX 331-1 or the processing circuitry 302 or the MUX 331-2 can receive an output from the processing circuitry 302 that is unrelated to the data provided by the MUX 331-1 to the processing circuitry 302. The structure of MUXes 331-1, 331-2 and processing circuitry 302 can be implemented between each layer of registers of the FIFO registers.

If the registers 301-1, . . . , 301-M and the registers 301-M+1, . . . , 301-P are implemented as latches, then data provided by a MUX (not shown) coupled to the registers 301-1, . . . , 301-M can pass through the registers 301-1, . . . , 301-M without being stored to the registers 301-1, . . . , 301-M. The data can be routed through by the MUX 331-1 at which time the MUX 331-1 can provide the data to the processing circuitry 302 or the MUX 331-2 based on a control signal and based on the Register 301-M+1, . . . , 301-P being vacant.

FIG. 4 illustrates an example flow diagram of a method 480 for performing operations in registers of a memory sub-system in accordance with a number of embodiments of the present disclosure.

At 481, a first plurality of registers can provide a first plurality of bits, received from sense amplifiers coupled to a memory array, to processing circuitry. The registers can be implemented using latches. The first plurality of registers can store the first plurality of bits prior to providing the first plurality of bits or may not store the first plurality of bits prior to providing the first plurality of bits. The first plurality of bits can be part of FIFO registers.

At 482, the processing circuitry can receive the first plurality of bits from the first plurality of registers. The processing circuitry can be coupled to the first plurality of bits and to a second plurality of bits. The first plurality of bits can be a first layer of registers and the second plurality of bits can be a second layer of registers. The first plurality of bits and the second plurality of bits can be FIFO bits.

At 483, the processing circuitry can perform an operation on the first plurality of bits to generate result bits. The result bits can be an output of the operation. The processing circuitry can perform a single operation or a plurality of operations to generate the result bits.

At 484, the result bits can be stored in the second plurality of registers. The result bits can be provided from the processing circuitry to the second plurality of bits. In various instances, the quantity of result bits can be equal to the quantity of registers of the second plurality of registers.

At 485, the result bits can be provided to a plurality of data input/output (I/O) lines prior to storing a second plurality of bits received from the first plurality of registers. The result bits can be provided from the second plurality of registers.

The first plurality of registers and the second plurality of registers can be latches. The latches can be used to store the first plurality of bits and the second plurality of bits or allow the first plurality of bits and the second plurality of bits to pass through the latches without storing the first plurality of bits or the second plurality of bits.

A different processing circuitry can be coupled to the first plurality of registers. The different processing circuitry can provide an output to the first plurality of registers. The different processing circuitry can perform a same operation as the processing circuitry or a different operation than the processing circuitry. The different processing circuitry can generate the second plurality of bits. The different processing circuitry can generate the second plurality of bits utilizing a third plurality of bits.

The second plurality of bits can be stored in the first plurality of registers. The first plurality of registers can provide the second plurality of bits to the second plurality of registers without performing additional operations at the processing circuitry. The different processing circuitry and the processing circuitry can perform different sub-operations of an operation. For example, the different processing circuitry and the processing circuitry can perform different sub-operation of an addition operation, a division operation, or a MAC operation.

In various instances, the different processing circuitry can perform a different operation utilizing a third plurality of bits to generate a fourth plurality of bits. The fourth plurality of bits can be an output of the different processing circuitry. The fourth plurality of bits can be provided to the first plurality of registers. The first plurality of registers can store the fourth plurality of bits. The fourth plurality of bits can be provided from the first plurality of registers to the processing circuitry to perform the operation utilizing the fourth plurality of bits.

In various instances, a memory sub-system can include a memory array, a plurality of sense amplifiers coupled to the memory array. The sense amplifiers sense a plurality of signals received from the memory array. The plurality of signals can represent a first plurality of bits stored in the memory array. The memory sub-system can include a first plurality of registers. The first plurality of registers can be coupled to the plurality of sense amplifiers. The first plurality of registers can store the first plurality of bits received from the plurality of sense amplifiers.

The memory sub-system can also include processing circuitry coupled to the first plurality of registers. The processing circuitry can receive the first plurality of bits from the first plurality of registers. The processing circuitry can perform an operation on the first plurality of bits to generate result bits.

The memory sub-system can include a second plurality of registers coupled to the processing circuitry and the plurality of registers. The second plurality of registers can store the result bits received from the processing circuitry. The second plurality of registers can provide the result bits to I/O lines prior to storing a second plurality of bits. The first plurality of registers and the second plurality of registers can be implemented using flip-flops.

The processing circuitry can perform the operation while the second plurality of registers is waiting for the first plurality of bits to be retrieved based on a clock signal. For example, the second plurality of registers store the first plurality of bits and can provide the first plurality of bits to the I/O lines based on the clock signal. The first plurality of bits stored in the second plurality of registers can be described as being pulled to describe the movement of the first plurality of bits from the second plurality of registers to the I/O lines.

Once the first plurality of bits is provided to the I/O lines, the second plurality of registers can be available to store additional bits. The second plurality of registers can receive the second plurality of bits from the first plurality of registers. The second plurality of registers can receive the second plurality of bits without the second plurality of bits being provided to the processing circuitry.

A MUX can provide the result bits or the second plurality of bits to the second plurality of registers. The MUX can provide the result bits or the second plurality of bits to the second plurality of registers based on whether the second plurality of registers are available to store data. For example, if the second plurality of registers are vacant, then the MUX can provide the result bits or the second plurality of bits to the second plurality of registers. The second plurality of registers can store the bits provided by the MUX.

In various examples, a plurality of sense amplifiers coupled to the memory array can sense a plurality of signals received from the memory array. The plurality of signals represent a first plurality of bits stored in the memory array. The first plurality of registers coupled to the sense amplifiers can store the first plurality of bits received from the plurality of sense amplifiers.

Processing circuitry coupled to the first plurality of registers can receive the first plurality of bits from the first plurality of registers and can perform an operation on the first plurality of bits to generate result bits. The processing circuitry can store the result bits in a register of the processing circuitry. The register of the processing circuitry can be independent from the first plurality of registers and a second plurality of registers that comprise FIFO registers.

The second plurality of registers coupled to the processing circuitry and the plurality of registers can store the result bits received from the register of the processing circuitry. The second plurality of registers can provide the result bits to I/O lines prior to storing a second plurality of bits.

The registers of the processing circuitry can be coupled to a clock line. The clock line can provide a clock signal which can be used to determine when to provide the result bits to the second plurality of registers. The clock lines can indicate (e.g., provide an indication) of when to provide the result bits to the second plurality of registers. The processing circuitry can include shift circuitry to shift the result bits utilizing the registers. The processing circuitry can accumulate the result bits with different result bits utilizing registers. The accumulation of results can be performed as part of a MAC operation performed by the processing circuitry.

Figure 5:
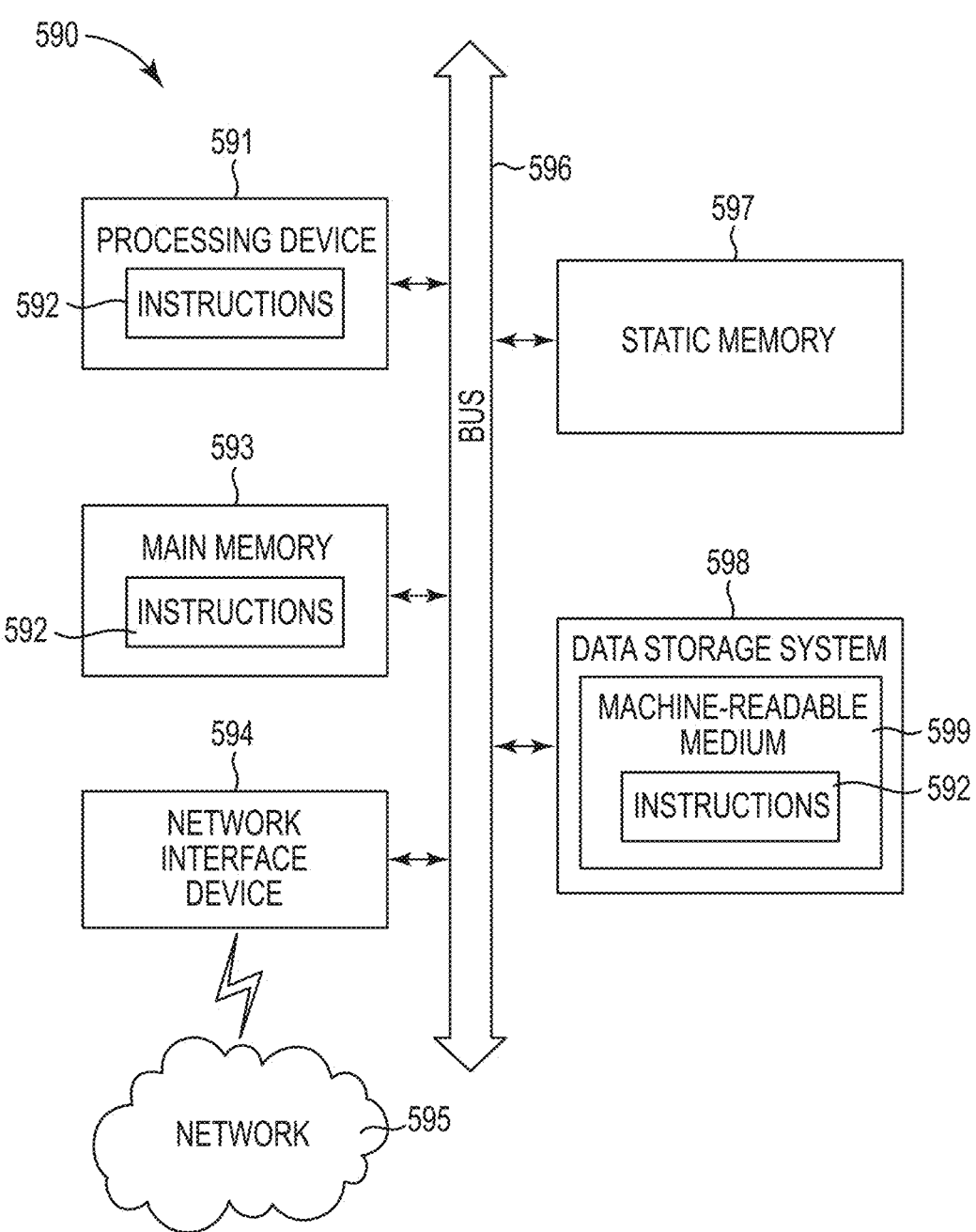
FIG. 5 illustrates an example machine of a computer system within which a set of instructions, for causing the machine to perform various methodologies discussed herein, can be executed.

FIG. 5 illustrates an example machine of a computer system 590 within which a set of instructions, for causing the machine to perform any one or more of the methodologies discussed herein, can be executed. In various embodiments, the computer system 590 can correspond to a host system (e.g., the system 110 of FIG. 1) that includes, is coupled to, or utilizes a memory sub-system (e.g., the memory sub-system 120 of FIG. 1) or can be used to perform the operations of a controller (e.g., the controller 140 of FIG. 1 and controller 223 of FIG. 2). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 590 includes a processing device 591, a main memory 593 (e.g., read-only memory (ROM), flash memory, dynamic random access memory (DRAM) such as synchronous DRAM (SDRAM) or Rambus DRAM (RDRAM), etc.), a static memory 597 (e.g., flash memory, static random access memory (SRAM), etc.), and a data storage system 598, which communicate with each other via a bus 596.

Processing device 591 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 591 can also be one or more special-purpose processing devices such as an application specific integrated circuit (ASIC), a field programmable gate array (FPGA), a digital signal processor (DSP), network processor, or the like. The processing device 591 is configured to execute instructions 592 for performing the operations and steps discussed herein. The computer system 590 can further include a network interface device 594 to communicate over the network 595.

The data storage system 598 can include a machine-readable storage medium 599 (also known as a computer-readable medium) on which is stored one or more sets of instructions 592 or software embodying any one or more of the methodologies or functions described herein. The instructions 592 can also reside, completely or at least partially, within the main memory 593 and/or within the processing device 591 during execution thereof by the computer system 590, the main memory 593 and the processing device 591 also constituting machine-readable storage media.

In one embodiment, the instructions 592 include instructions to implement functionality corresponding to the registers 101 and processing circuitry 102 of FIG. 1. While the machine-readable storage medium 599 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combinations of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a memory array;
a plurality of sense amplifiers coupled to the memory array and configured to sense a plurality of signals received from the memory array that represent a first plurality of bits stored in the memory array;
a first plurality of registers coupled to the plurality of sense amplifiers and configured to store the first plurality of bits received from the plurality of sense amplifiers;
processing circuitry coupled to the first plurality of registers and configured to:
receive the first plurality of bits from the first plurality of registers; and
perform an operation on the first plurality of bits to generate result bits; and
a second plurality of registers coupled to the processing circuitry and the first plurality of registers and configured to:
store the result bits received from the processing circuitry; and
provide the result bits to a plurality of data input/output (I/O) lines prior to storing a second plurality of bits.

2. The apparatus of claim 1, wherein the first plurality of registers and the second plurality of registers are flip-flops.

3. The apparatus of claim 1, wherein the processing circuitry is configured to perform the operation while the second plurality of registers is waiting for the first plurality of bits to be retrieved based on a clock signal.

4. The apparatus of claim 1, wherein the processing circuitry is configured to perform the operation while the second plurality of registers is waiting for the results bits to be retrieved based on a clock signal.

5. The apparatus of claim 1, wherein the second plurality of registers are further configured to receive the second plurality of bits from the first plurality of registers.

6. The apparatus of claim 5, further comprising a multiplexor (MUX) configured to provide the result bits or the second plurality of bits to the second plurality of registers.

7. The apparatus of claim 6, wherein the MUX is configured to provide the result bits or the second plurality of bits based on whether the second plurality of registers are available to store data.

8. A method, comprising:
providing, from a first plurality of registers, a first plurality of bits received from sense amplifiers coupled to a memory array to processing circuitry;
receiving, at the processing circuitry, the first plurality of bits from the first plurality of registers;
performing, at the processing circuitry, an operation on the first plurality of bits to generate result bits;
storing the result bits in a second plurality of registers; and
providing the result bits to a plurality of data input/output (I/O) lines prior to storing a second plurality of bits received from the first plurality of registers.

9. The method of claim 8, wherein the first plurality of register and the second plurality of registers are flip-flops.

10. The method of claim 8, further comprising performing, at different processing circuitry, the operation on a third plurality of bits to generate the second plurality of bits.

11. The method of claim 10, further comprising storing the second plurality of bits in the first plurality of registers.

12. The method of claim 11, further comprising providing the second plurality of bits from the first plurality of registers to the second plurality of registers without performing additional operations at the processing circuitry.

13. The method of claim 8, further comprising performing, at different processing circuitry, a different operation on a third plurality of bits to generate the second plurality of bits.

14. The method of claim 13, further comprising storing the second plurality of bits in the first plurality of registers.

15. The method of claim 8, further comprising performing, at different processing circuitry, a different operation on a third plurality of bits to generate a fourth plurality of bits.

16. The method of claim 15, further comprising:
storing the fourth plurality of bits in the first plurality of registers; and
providing the fourth plurality of bits from the first plurality of registers to the processing circuitry to perform the operation utilizing the fourth plurality of bits.

17. An apparatus, comprising:
a memory array;
a plurality of sense amplifiers coupled to the memory array and configured to sense a plurality of signals received from the memory array that represent a first plurality of bits stored in the memory array;
a first plurality of registers coupled to the plurality of sense amplifiers and configured to store the first plurality of bits received from the plurality of sense amplifiers;
processing circuitry coupled to the first plurality of registers and configured to:
receive the first plurality of bits from the first plurality of registers; and
perform an operation on the first plurality of bits to generate result bits;
store the result bits in a register of the processing circuitry; and
a second plurality of registers coupled to the processing circuitry and the plurality of registers and configured to:
store the result bits received from the register of the processing circuitry; and
provide the result bits to a plurality of data input/output (I/O) lines prior to storing a second plurality of bits.

18. The apparatus of claim 17, wherein the register is coupled to a clock line to indicate when to provide the result bits to the second plurality of registers.

19. The apparatus of claim 17, wherein the processing circuitry is further configured to shift the result bits utilizing the register.

20. The apparatus of claim 17, wherein the processing circuitry is further configured to accumulate the result bits with different result bits utilizing the register.

\* \* \* \* \*